US012692601B2

(12) United States Patent
Olsen et al.

(10) Patent No.: US 12,692,601 B2
(45) Date of Patent: Jul. 28, 2026

(54) APPARATUS AND SYSTEM FOR DELIVERING GAS TO A PROCESS CHAMBER

(71) Applicant: Applied Materials, Inc., Santa Clara, CA (US)

(72) Inventors: Christopher S. Olsen, Fremont, CA (US); Lara Hawrylchak, Gilroy, CA (US); Tobin Kaufman-Osborn, Sunnyvale, CA (US); Wenfei Zhang, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 363 days.

(21) Appl. No.: 17/511,639

(22) Filed: Oct. 27, 2021

(65) Prior Publication Data

US 2022/0154338 A1     May 19, 2022

Related U.S. Application Data

(60) Provisional application No. 63/113,316, filed on Nov. 13, 2020.

(51) Int. Cl.
*C23C 16/455*     (2006.01)
*H10P 72/00*     (2026.01)

(52) U.S. Cl.
CPC .. *C23C 16/45563* (2013.01); *C23C 16/45591* (2013.01); *H10P 72/0402* (2026.01);
(Continued)

(58) Field of Classification Search
CPC ............ C23C 16/4408; C23C 16/4409; C23C 16/455; C23C 16/45504; C23C 16/45506;
(Continued)

(56) References Cited

U.S. PATENT DOCUMENTS 5,390,785 A * 2/1995 Garric ................... G03F 7/7075
                                                     206/509
6,093,252 A * 7/2000 Wengert ............ H01L 21/68735
                                                     118/725
(Continued)

FOREIGN PATENT DOCUMENTS

CN        104882399 A     9/2015
JP        2016539490 A    12/2016
(Continued)

OTHER PUBLICATIONS

International Search Report/Written Opinion issued to PCT/US2021/056732 on Feb. 21, 2022.
(Continued)

*Primary Examiner* — Kurt Sweely
(74) *Attorney, Agent, or Firm* — Patterson + Sheridan, LLP

(57)     ABSTRACT

Embodiments described herein generally relate to a gas assembly disposed between a mainframe door and process chamber. The gas assembly provides multi-zone gas cross-flow distribution into a processing volume. Each of the zones are independently controlled. The zones each include a single nozzle, a plenum fluidly coupled to multiple nozzles, or a combination thereof. The nozzles, such as plenums included with nozzles, are disposed within the manifold between the first major surface and the second major surface of the manifold. An outlet of the nozzles are in fluid communication with the second major surface of the manifold, and in fluid communication with a volume of the process chamber. The gas assembly includes an adapter plate configured to be coupled to a vacuum mainframe robot.

20 Claims, 7 Drawing Sheets

(52) U.S. Cl.
CPC .... *H10P 72/0462* (2026.01); *C23C 16/45561* (2013.01); *H10P 72/0454* (2026.01)

(58) Field of Classification Search
CPC .......... C23C 16/45508; C23C 16/4551; C23C 16/45512; C23C 16/45517; C23C 16/45519; C23C 16/45557; C23C 16/45561; C23C 16/45563; C23C 16/45568; C23C 16/45578; C23C 16/4558; C23C 16/45582; C23C 16/45585; C23C 16/45587; C23C 16/45591; C30B 25/14; C30B 25/16; C30B 25/165; H01L 21/67201; H01L 21/67389; H01L 21/67393; H01L 21/67772; H01J 37/3244; H01J 37/32449; H10P 72/0402; H10P 72/0462; H10P 72/0454
See application file for complete search history.

(56) References Cited

U.S. PATENT DOCUMENTS

| | | | | |
|---|---|---|---|---|
| 8,187,381 | B2 * | 5/2012 | Sangam | H01L 21/02181 |
| | | | | 117/200 |
| 8,377,213 | B2 * | 2/2013 | Balasubramanyam | |
| | | | | C23C 16/4401 |
| | | | | 156/345.31 |
| 9,004,086 | B2 * | 4/2015 | Nixon | B08B 7/0021 |
| | | | | 134/198 |
| 9,435,025 | B2 * | 9/2016 | Madiwal | H01L 21/67126 |
| 9,540,731 | B2 * | 1/2017 | Noorbakhsh | C23C 16/45565 |
| 2004/0261712 | A1 * | 12/2004 | Hayashi | H01L 21/67069 |
| | | | | 118/723 E |
| 2005/0221618 | A1 * | 10/2005 | AmRhein | C23C 16/452 |
| | | | | 156/345.29 |
| 2008/0202419 | A1 | 8/2008 | Smith et al. | |
| 2008/0315141 | A1 * | 12/2008 | Thrash | F16K 51/02 |
| | | | | 251/327 |
| 2009/0165718 | A1 * | 7/2009 | Lee | C23C 14/243 |
| | | | | 118/724 |
| 2010/0022093 | A1 * | 1/2010 | Yamaguchi | H01L 21/67196 |
| | | | | 156/345.31 |
| 2014/0106478 | A1 * | 4/2014 | Bang | C23C 16/455 |
| | | | | 118/712 |
| 2015/0240359 | A1 | 8/2015 | Jdira et al. | |
| 2019/0032216 | A1 * | 1/2019 | Shah | C23C 14/564 |
| 2019/0105614 | A1 * | 4/2019 | Pandey | H01L 21/67017 |
| 2019/0180981 | A1 | 6/2019 | Rogers | |

FOREIGN PATENT DOCUMENTS

| | | |
|---|---|---|
| KR | 10-2018-0115361 A | 10/2018 |
| WO | 2010022215 A2 | 2/2010 |

OTHER PUBLICATIONS

Japanese Office Action issued to patent application No. 2023-528439 on May 14, 2024.
KR Office Action Dtd Jul. 23, 2024 for KR 10-2023-7019542.
TW Office Action Dtd Jul. 23, 2025 for TW 110142212.

* cited by examiner

APPARATUS AND SYSTEM FOR DELIVERING GAS TO A PROCESS CHAMBER

CROSS-REFERENCE TO RELATED APPLICATIONS

This application claims the benefit of U.S. Provisional Patent Application Ser. No. 63/113,316, filed on Nov. 13, 2020, the entirety of which is herein incorporated by reference.

BACKGROUND

Field

Embodiments of the present disclosure relate to an apparatus and system for delivering gas to a process chamber.

Description of the Related Art

Electronic device manufacturing systems include one or more process chambers configured to perform any number of substrate processes including, e.g., degassing, pre-cleaning or cleaning, deposition (e.g., chemical vapor deposition, physical vapor deposition, and/or atomic layer depositing), coating, oxidation, nitration, etching (e.g., plasma etching), and the like. Substrates include semiconductor wafers, glass plates or panels, and/or other workpieces used to make electronic devices or circuit components. Substrates are transferred between a process chamber and a transfer chamber through a chamber port assembly, such as an assembly with a slit valve. A chamber port assembly provides an interface between chamber ports of a process chamber and transfer chamber. Particulate matter from chamber hardware may migrate to a substrate during a transfer of the substrate through a chamber port assembly. The particulate matter affects the processing of the substrate, such as increasing electronic device defects.

Accordingly, there is a need for apparatuses and systems for processing and transferring a substrate within and between process chambers without introducing contaminants to the substrate or in the process volumes.

SUMMARY

In one embodiment, a manifold is provided having an adapter plate with a first major surface, a second major surface opposing the first major surface, and a cut out defined by an opening in the first major surface extending to an opening in the second major surface. One or more plenums are disposed within the manifold between the first major surface and the second major surface. Each of the plenums include one or more nozzles in fluid communication with a bottom surface of the opening and the opening of the second major surface, each of the one or more plenums is coupled to respective flow control valves.

In another embodiment, a process system is provided having a process chamber with a substrate support disposed therein. The process system includes a gas assembly having a manifold with a first major surface and a second major surface. One or more gas lines are disposed within the manifold between the first major surface and the second major surface, each of the gas lines include a nozzle in fluid communication with a process volume of the process chamber. The manifold is coupled to the process chamber at the second major surface and a mainframe door is coupled to the manifold at the first major surface.

In another embodiment, gas flow system is provided including a manifold having a first major surface, a second major surface, an opening extending from the first major surface to the second major surface. One or more plenums are disposed within the manifold between the first major surface and the second major surface. Each of the plenums include one or more nozzles. The one or more nozzles are in fluid communication with the second major surface, and one or more gas lines are disposed within the manifold. At least two of the gas lines are controlled independently relative to one another. Each of the gas lines include a gas outlet on the upper surface of the manifold. A transfer system mainframe door is coupled to the first major surface and a process chamber including a slot. The slot is in fluid communication with the one or more nozzles.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of scope, as the disclosure may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments described herein generally relate to a gas assembly coupled to a process chamber. In some embodiments, which can be combined with other embodiments described herein, the gas assembly is disposed between a mainframe (e.g., transfer chamber) and process chamber. Other locations for the gas assembly are also contemplated such as locations coupled to the process chamber and separate from the mainframe (e.g., transfer chamber) location. The gas assembly provides multi-zone gas cross-flow distribution into a processing volume of the process chamber. Each of the zones are independently controlled. The zones each include a single nozzle, a plenum fluidly coupled to multiple nozzles, or a combination thereof. The nozzles, and/or the plenums included with nozzles, are disposed within the manifold between a first major surface and a second major surface of the manifold. An outlet of the nozzles are in fluid communication with the second major surface of the manifold, and in fluid communication with a processing volume of the process chamber. The multiple, independently controlled zones provide controllability of mass flow for flow sensitive chemical processes. The gas assembly includes an adapter plate configured to be coupled to a vacuum mainframe door.

Figure 1:
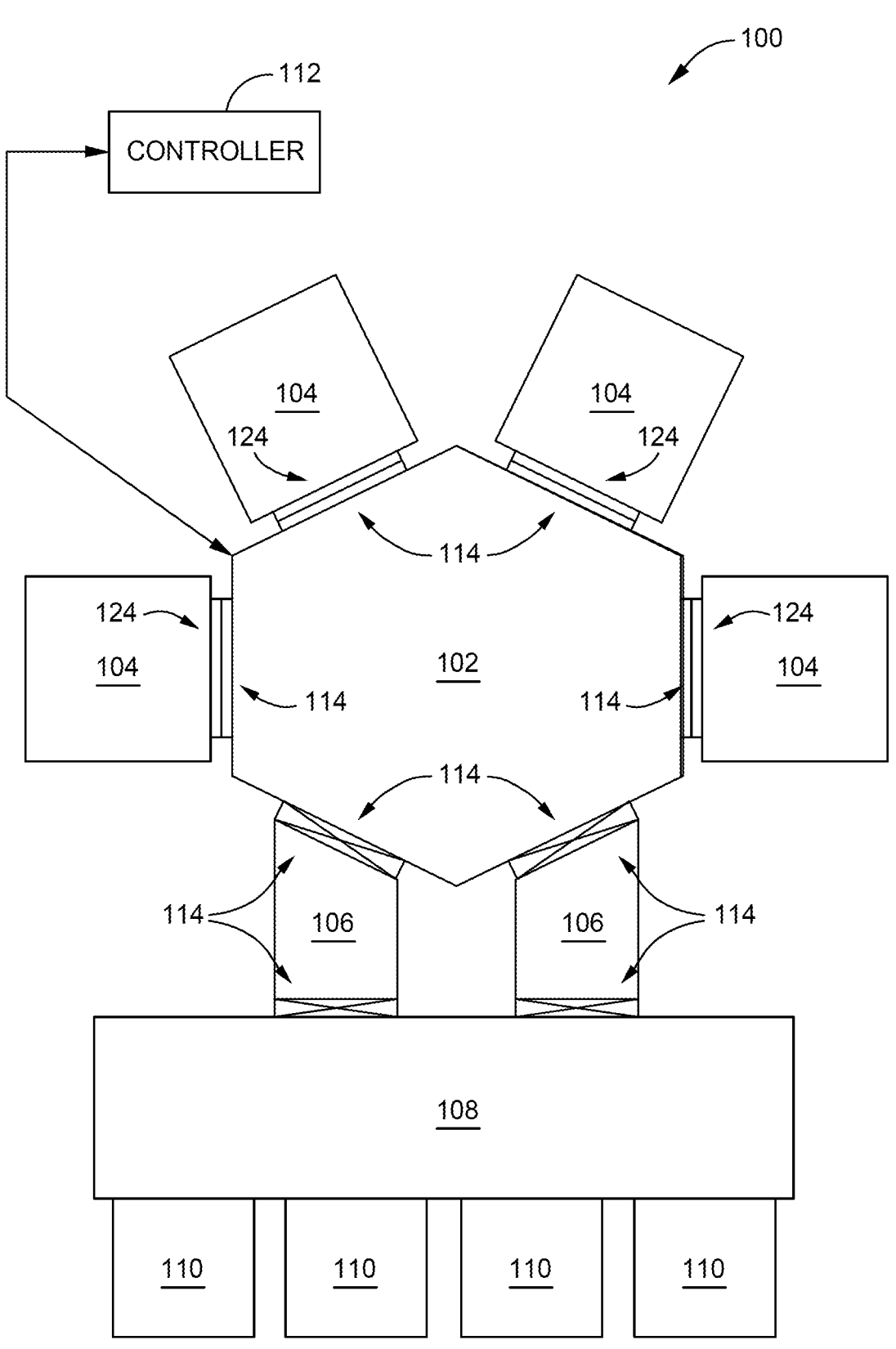
FIG. 1 illustrates a schematic plan view of a processing system, according to an embodiment.

FIG. 1 illustrates an electronic device manufacturing system 100 in accordance with one or more embodiments. Electronic device manufacturing system 100 may be configured to process multiple substrates concurrently. Substrates include semiconductor wafers, glass plates or panels, and/or other workpieces used to make electronic devices or circuit components. Electronic device manufacturing system 100 include a transfer chamber 102, a plurality of process chambers 104, and one or more load lock chambers 106, each of which may operate at a vacuum pressure. Transfer chamber 102 includes a robot (not shown) configured to transfer substrates to and from each process chamber 104 and each load lock chamber 106.

Process chambers 104 each perform a same or a different substrate process including, e.g., deposition (e.g., chemical vapor deposition (CVD), physical vapor deposition (PVD), and/or atomic layer deposition), oxidation, nitration, coating, etching (e.g., plasma etching), polishing, cleaning, lithography, degassing, or the like. Other substrate processes may additionally or alternatively be performed by process chambers 104. Within each process chamber 104, one or more substrates are processed. In some embodiments, the process chamber 104 is an epitaxy chamber or a radical oxidation chamber, such as an in situ steam generation chamber Load lock chambers 106 are each a batch-type or single substrate-type load lock chamber. Load lock chambers 106 may be coupled to a factory interface 108 and may provide a first vacuum interface between factory interface 108 and transfer chamber 102.

Factory interface 108 may be coupled to one or more FOUPs (front opening unified pods) 110. Each FOUP 110 is a container having a stationary cassette for holding multiple substrates. FOUPs 110 each have a front opening interface configured to be used with factory interface 108. In other embodiments, any suitable type of pod and/or load port may be used instead of FOUPs 110. Factory interface 108 may have one or more robots (not shown) configured to transfer substrates in any sequence or direction via linear, rotational, and/or vertical movement between FOUPs 110 and load lock chambers 106. Electronic device manufacturing system 100 have other suitable numbers of FOUPs 110.

A controller 112 controls some or all of the processing and transferring of substrates in and through electronic device manufacturing system 100. Controller 112 may be, e.g., a general purpose computer and/or may include a microprocessor or other suitable CPU (central processing unit), a memory for storing software routines that control electronic device manufacturing system 100, input/output peripherals, and support circuits (such as, e.g., power supplies, clock circuits, circuits for driving robots, a cache, and/or the like).

The transfer chamber 102 includes mainframe doors 114, such as slit valves, at each interface between the transfer chamber 102 and each chamber (e.g., process chamber 104, lock load chamber 106). A manifold 124 is disposed between each mainframe 114 that coupled to a respective process chamber. Alternatively, the manifold 124 is coupled to each process chamber at locations separate and distinct from the mainframe doors 114. The mainframe door 114 is directly attached to the manifold 124 using any suitable manner, such as with a plurality of fasteners. The fasteners can be threaded screws or bolts. One or more O-rings are disposed between the mainframe door 114 and the manifold 124, and between the manifold 124 and process chamber 104 to provide an airtight seal there between. The airtight seal allows substrates to pass between chambers without either chamber losing vacuum pressure therein. Similarly, a second side of the manifold 124 is coupled to a sidewall of an interfacing process chamber 104 Each of the transfer chamber 102, process chambers 104 and load lock chambers 106 have one or more ports (not shown). A port is an opening in a side wall of a chamber configured to allow a substantially, horizontally-oriented substrate to pass there through via a robot or other suitable mechanism. The chamber ports are elongated slots or slits, or any shape suitable for passing a substrate there through. The manifold 124 includes an opening that corresponds to the chamber ports interfacing the manifold 124 (e.g., the port for the mainframe door and the port for the process chamber). The opening is any suitable shape such as oval, elliptic, oblong, circular, rectangular.

Figure 2:
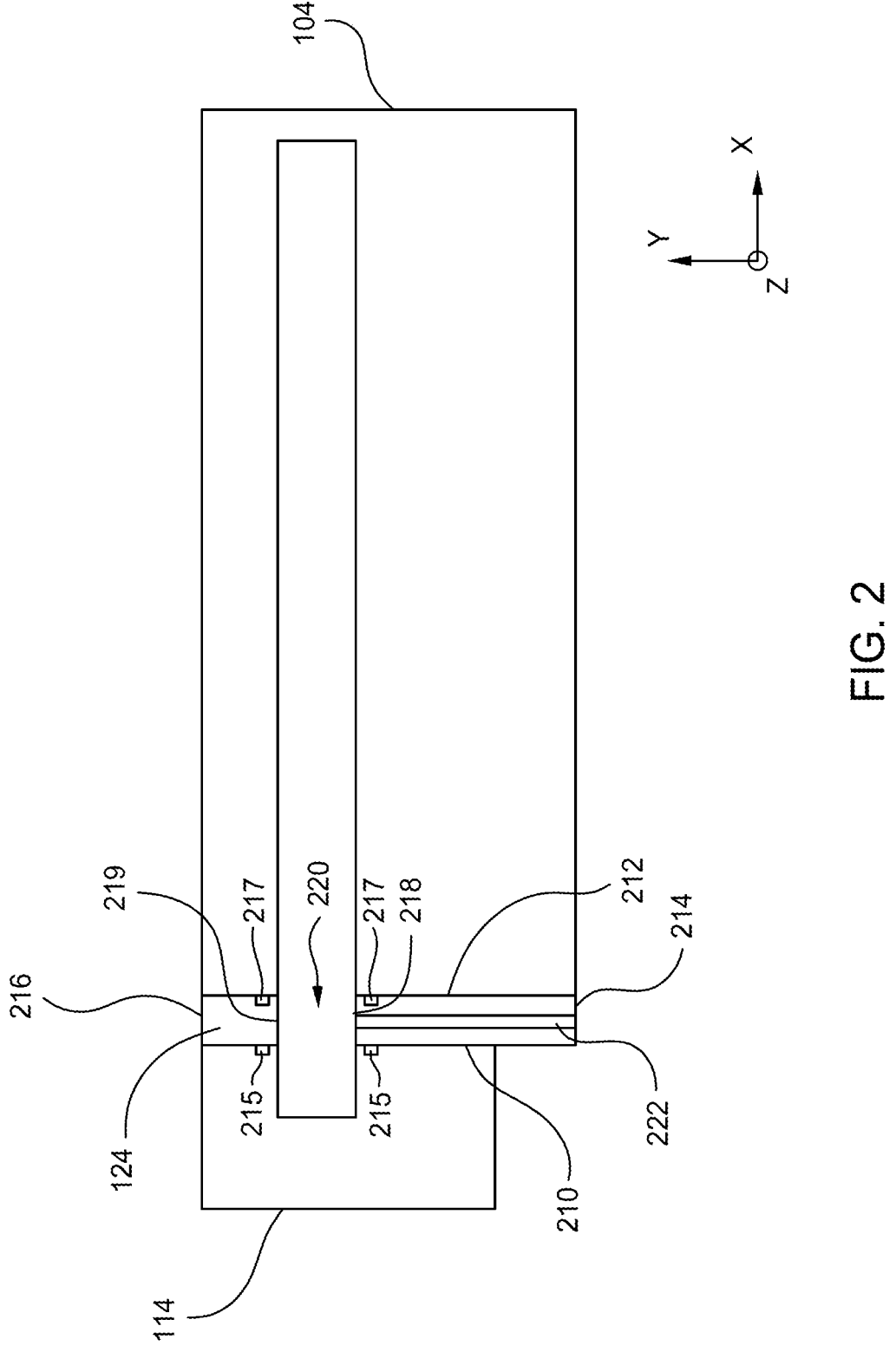
FIG. 2 illustrates a schematic cross-sectional partial side view of a processing system, according to an embodiment.

FIG. 2 illustrates a schematic cross-sectional side view of a processing system, according to an embodiment. The manifold 124 is disposed between the mainframe door 114 and the process chamber 104. A substrate is transferred from the transfer chamber 102, through a port in the mainframe door 114, through an opening 220 of the manifold 124, and through a port of the process chamber 104. The opening 220 extending through the manifold 124 from a first major surface 210 to a second major surface 212 of the manifold 124. In some embodiments, which can be combined with other embodiments described herein, the manifold 124 includes a first major surface 210 interfacing the mainframe door 114, and a second major surface 212 interfacing the process chamber 104. A plurality of gas passages 222 are provided extending in a y-direction (e.g., vertical) from a third surface 214 of the manifold to a lower surface 218 of an opening 220 of the manifold. Although the gas passages 222 are depicted to extend from the bottom surface (e.g., third surface 214) of the manifold 124 to the lower surface 218 of the opening 220 of the manifold 124, other orientations are contemplated, such as extending from the top surface 216 of the manifold 124 to the upper surface 219 of the opening 220 of the manifold or from a side of the manifold 124 interfacing the mainframe door 114. In some embodiments, which can be combined with other embodiments described herein, a width of the manifold from the first major surface to the second major surface is about 0.5 in to about 1 in, such as about 0.7 in. In one example, the manifold 124 is easily retrofitted into existing systems which were originally designed or constructed such that the process chamber 104 directly couples to the mainframe door 114 or transfer chamber 102. A mainframe groove 215 is formed in a first major surface of the mainframe door 114 encircling the port of the mainframe door 114. The groove 215 of the mainframe door 114 interfaces the first major surface 210 of the manifold 124. The groove 215 is configured to receive a seal, such as an O-ring to provide an airtight seal between the mainframe door 114 and the manifold 124. A manifold groove 217 is formed in the second side of 212 of the manifold 124 interfacing the process chamber 104. The groove 217 encircles the opening 220 and is configured to receive a seal such as an O-ring to provide an airtight seal between the manifold 124 and the process chamber 104.

Figure 3A:
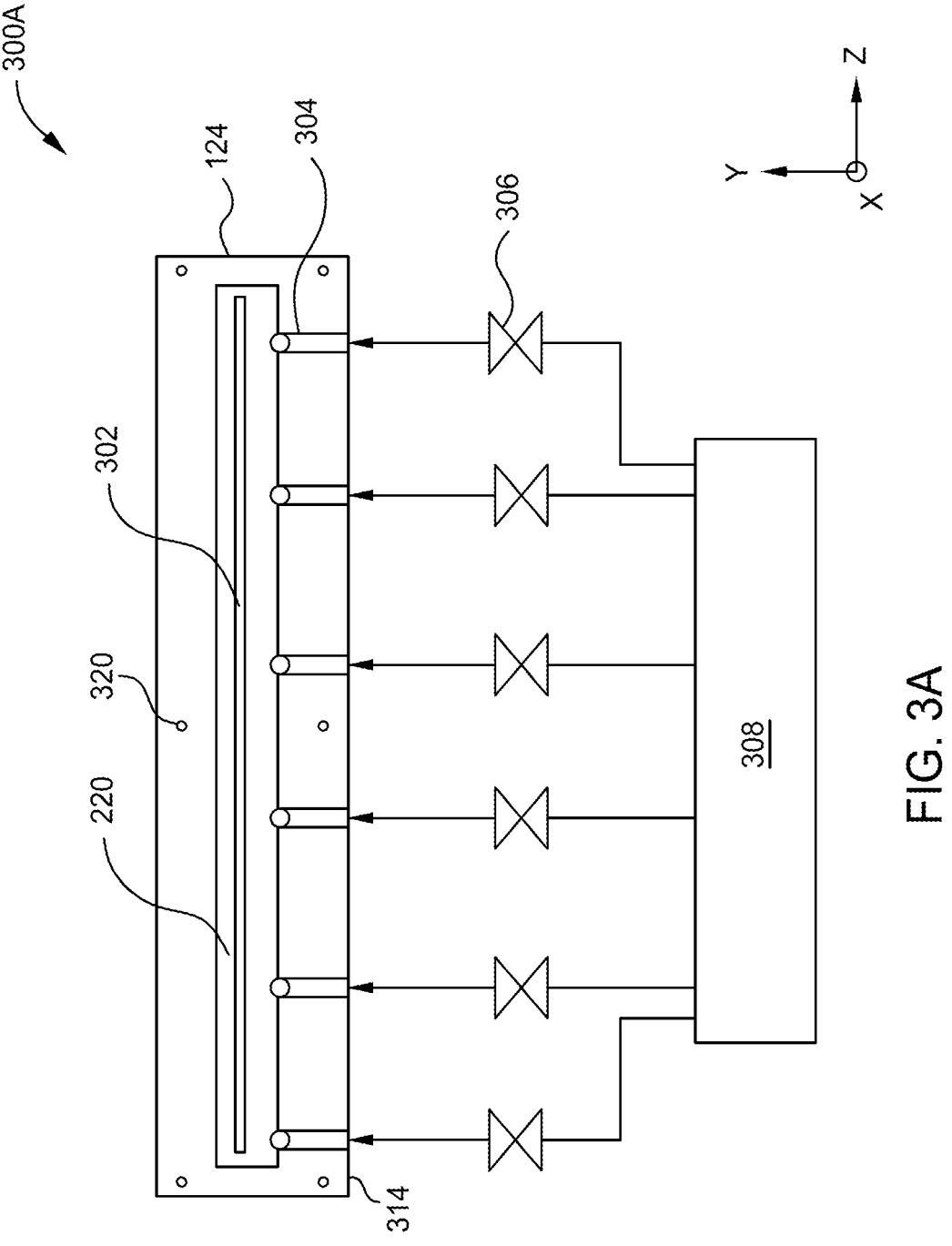
FIG. 3A illustrates a schematic cross-sectional front view of a single nozzle per multi-zone gas assembly, according to an embodiment.

FIG. 3A illustrates a schematic cross-sectional front view of a multi-zone gas assembly 300A having a single nozzle per zone, according to an embodiment. The gas assembly 300A depicted in FIG. 3A includes a plurality of zones, each zone including a single nozzle 304. Each of the zones (e.g., nozzles 304) are independently controlled with respect to one another. Each zone includes independently controlled mass flow control valves 306. The mass flow control valves 306 are coupled to a gas source 308. The gas source 308 includes any gas such as nitrogen, hydrogen, oxygen, or combinations thereof. In some embodiments, which can be combined with other embodiments described herein, the manifold 124 includes about 2 to about 9 zones of gas flow. Each of the nozzles are independently controlled (e.g., one nozzle per zone). Each zone is equal in width or at least two zones are not equal in width based on desired amount of additional control. Larger numbers of zones having smaller widths provide more tunability compared to fewer zones having larger widths. In some embodiments, which can be combined with other embodiments described herein, additional zones at the edges are provided for additional tunability at the edges of the substrate. The stated otherwise, the number of zones per unit length (e.g., zone density) may be greater at laterally outward edges of the manifold 124 relative to a central region of the manifold 124. A deflector 302 provides a hood (e.g., shelf) substantially parallel to the lower and upper surfaces of the opening 220 (e.g., perpendicular to the directly of gas flow). The deflector extends at least partially into the opening and is configured to deflect the gas flow from the nozzles 304 into the process volume. Without being bound by theory, it is believed that the deflector provides a point of collision that restricts the flow of supersonic gases provided from the nozzles 304 to the process volume. The resulting gas flow together with the use of independently controlled zones provides a customizable flow (e.g., uniform or non-uniform flow) from the gas assembly to the process volume and improved repeatability across processes.

Figure 3B:
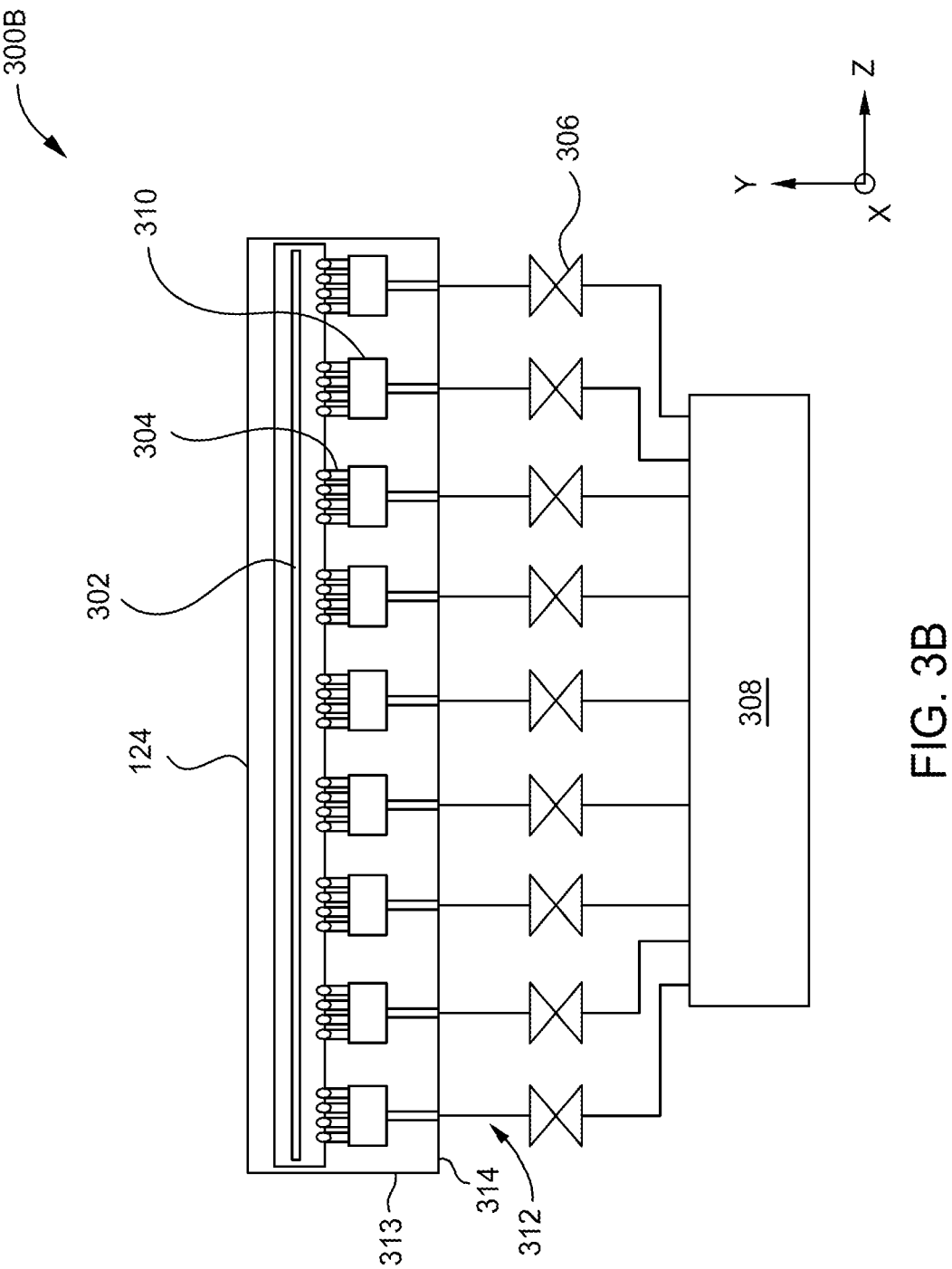
FIG. 3B illustrates a schematic cross-sectional front view of a multi-nozzle per multi-zone gas assembly, according to an embodiment.

FIG. 3B illustrates a schematic cross-sectional front view of multi-zone gas assembly 300B having multiple nozzles per zone, according to an embodiment. The gas assembly 300B depicted in FIG. 3B provides about 2 to about 9 zones, each zone includes a plenum 310 having a plurality of nozzles 304, such as about 4 to about 6 nozzles per plenum 310. Each plenum 310 is coupled to a gas line 312 that is independently controlled via a respective mass flow valve 306. One or more gas passages 313 are formed in the manifold 124. Each of the one or more gas passages 313 extend from a third surface 314 of the manifold 124 to the one or more plenums 310. Each of the gas passages are configured to receive a gas line, or are in fluid communication with a gas line. The plenums 310 are equal in width, or alternatively, vary in width based on desired amount of mass flow control. Each plenum has a uniform number of nozzles per plenum, or alternatively, at least one plenum as more than at least one other plenum. A plurality of fastener openings 320 for accommodating fasteners are disposed on the manifold 124. The plurality of fastener openings 320 for accommodating fasteners are disposed from the first major surface to the second major surface around a perimeter of the manifold 124.

Figures 4A, 4B, 5A:
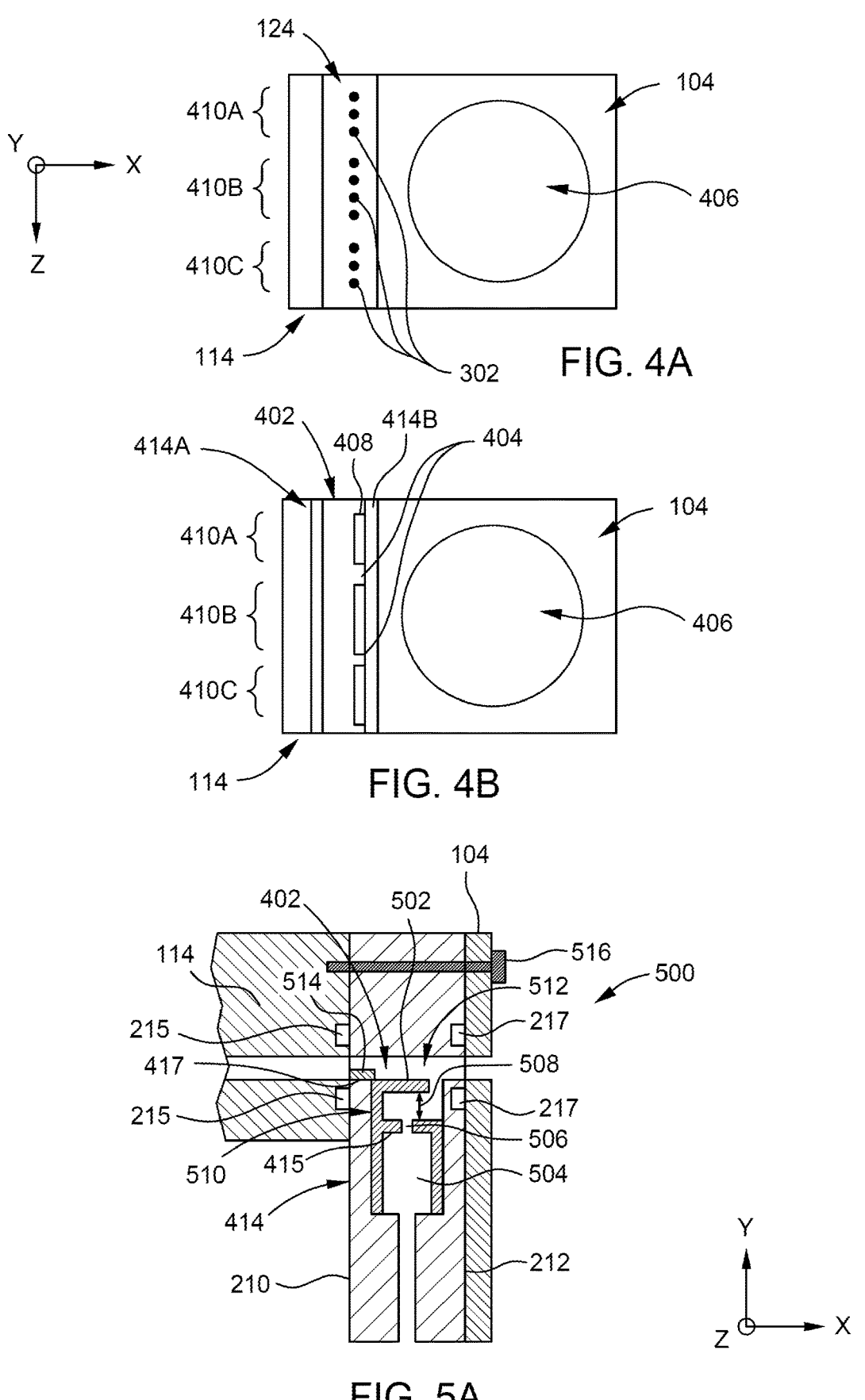
FIG. 4A illustrates a schematic cross-sectional partial top view of a processing system, according to an embodiment.
FIG. 4B illustrates a schematic cross-sectional partial top view of a processing system, according to an embodiment.
FIGS. 5A to 5D illustrate schematic cross-sectional side views of adapter plates and deflector inserts, according to some embodiments.

FIG. 4A illustrates a schematic cross-sectional top view of a processing system, according to an embodiment. A mainframe door 114 is coupled to a first major surface of a manifold 124. A plurality of gas line outlets 304 are shown, such as outlets of nozzles described with respect to FIGS. 3A and 3B. By way of example, FIG. 4A depicts three independently controlled zones 410A, 410B, 410C. Zones 410A and 410C include 3 nozzles and zone 410B includes 4 nozzles. The gas from the nozzles are provided as cross-flow into the side of the process volume via a slot (e.g., slit valve opening) within the process chamber sidewall. A deflector 302 (shown in FIG. 3A) may be provided to facilitate lateral flow of gases. The gas flows across a surface of a substrate support 406 and/or a substrate disposed on the substrate support 406.

FIG. 4B illustrates a schematic top view of a processing system, according to an embodiment. FIG. 4B provides a manifold 124 having an adapter plate 414 that surrounds and/or supports a deflector 402. The adapter plate 414 has a first portion 414A proximate to the mainframe door 114 and a second portion 414B proximate to the process chamber 104.

Figure 5B:
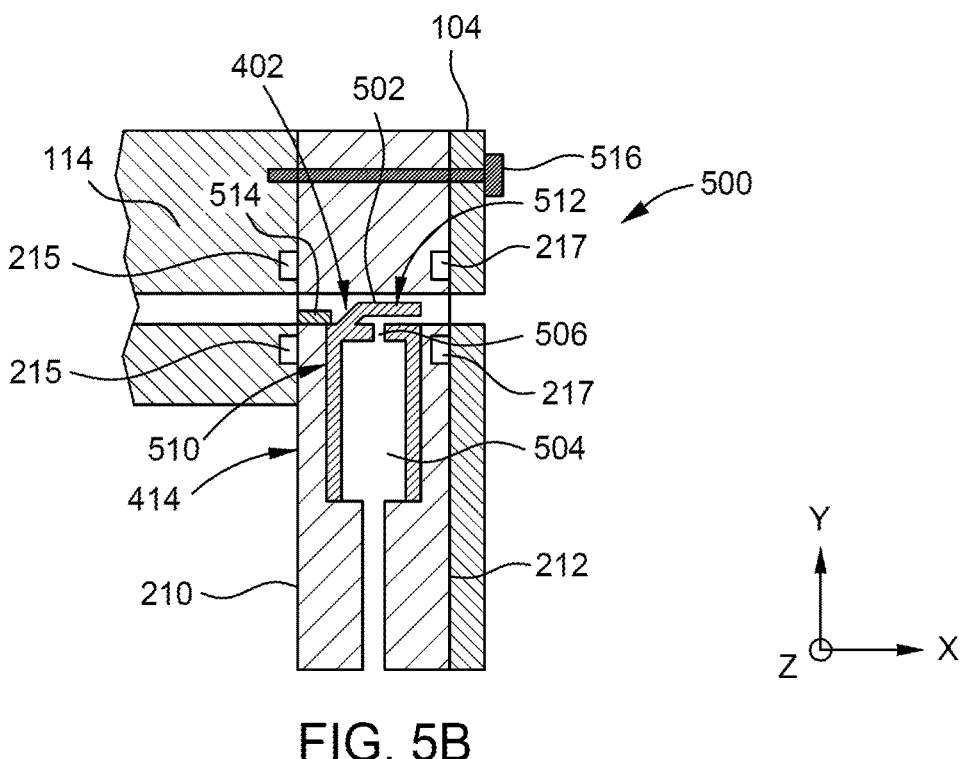

FIGS. 5A to 5D illustrate schematic cross-sectional side views of a gas assembly 500 having an adapter plate 414 and deflector 402. The adapter plate 414 is coupled to a process chamber 104 and mainframe door 114 by a fastener 516 extending from the process chamber 104, through an aperture of the adapter plate 414, and to the mainframe door 114. In some embodiments, which can be combined with other embodiments described herein, the deflector 402 is a removable deflector, such as a removable insert. Although the figures depict the adapter plate 414 and the deflector 402 as two separate parts, an adapter plate 414 that is integral with a deflector 402 is also contemplated. The deflector 402 includes a hood 502, a plenum 504, nozzle outlet 506, and backboard 510 supporting the hood 502. A distance 508 between the nozzle outlet 506 and the hood 502 is about 0.5 to about 3 mm, such as about 1 mm to about 2 mm. A gap 512 is also provided between the hood 502 and the top surface of the opening 220. In some embodiments, which can be combined with other embodiments described herein, a height of the gap 512 is equal a height of the opening 220 as shown in FIG. 5A. Alternatively, the hood 502 extends into the opening 220 such that the height of the gap 512 is smaller than the height of the opening 220 as shown in FIG. 5B. The nozzle outlets 506 are substantially coplanar with the lower surface 218 of an opening 220. A second gas flow from the mainframe apparatus can be introduced through the gap. In some embodiments, which can be combined with other embodiments described herein, the deflector 402 is a removable insert that is installed within the adapter plate through the port of the mainframe door. The deflector 402 is secured in place using a stop plate 514, which is inserted through an aperture in the adapter plate 414. The bottom of the aperture of the adapter plate 414 is coplanar with the top surface of the deflector surface, or is fitted in an aperture of the deflector. In some embodiments, which can be combined with other embodiments described herein, the bottom of the aperture of the adapter plate 414 is coplanar with the bottom of the opening 220. In some embodiments, which can be combined with other embodiments described herein, the deflector 402 extends from a surface 415 of the removable insert including an outlet 506 of the one or more nozzles to a bottom surface 417 of the opening of the adapter plate 414 and the one or more nozzles are oriented towards the deflector 402. In some embodiments, which can be combined with other embodiments described herein, the deflector is integral with the adapter plate 414 and extends from a surface 415 of the adapter plate 414 comprising an outlet 506 of the one or more nozzles to a bottom surface 417 of the opening of the adapter plate 414 and wherein the one or more nozzles are oriented towards the deflector.

Referring back to FIG. 4B, the hood 502 of the deflector 402 extends in an x-direction from a position proximate to the mainframe door 114 to a position proximate to the process chamber 104. A plurality of gaps 408 is provided between a leading edge of the hood 502 and the adapter plate 414 portion proximate to the process chamber 104. The gaps 408 provide a passageway for the gas to flow from the nozzle outlets into the process volume of the processing chamber. Each gap corresponds to a plenum or a nozzle for gas to exit. The deflector 402 further includes a plurality of fins 404. Each fin 404 separates adjacent gaps 408. Each fin extends from a surface of the removable insert having the outlet of the one or more nozzles 506 to the to the hood 502.

The fins 404 are perpendicular to a longitudinal axis of the deflector 402 (e.g., the x-direction), or the fins 404 are angled in an acute or obtuse angle relative a plane of the second major surface.

Figure 5C:
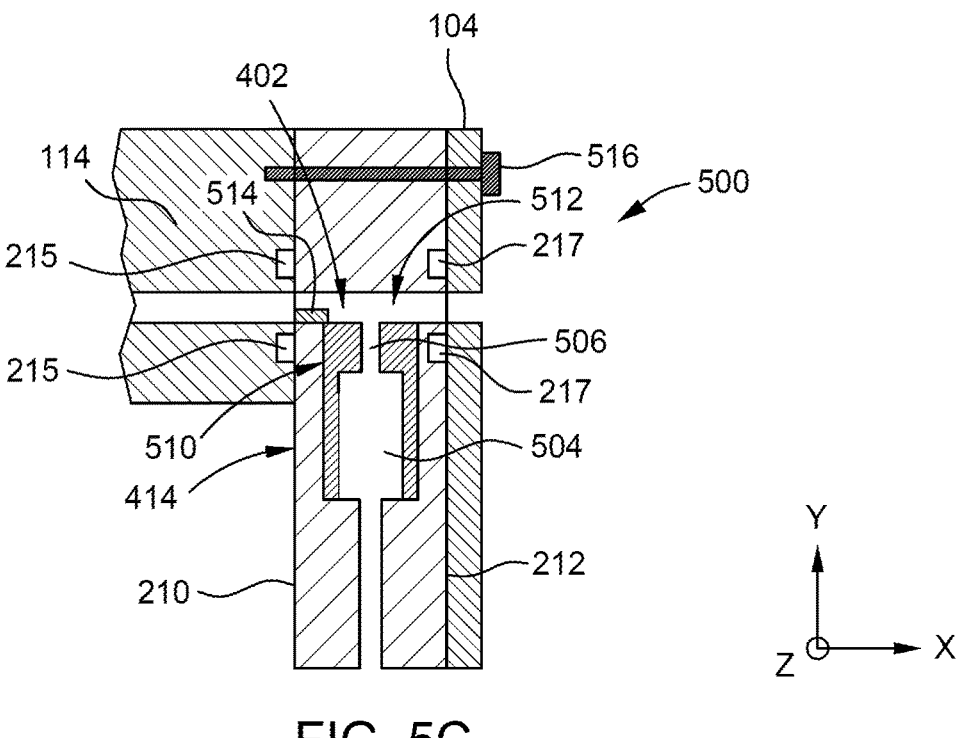
Figure 5D:
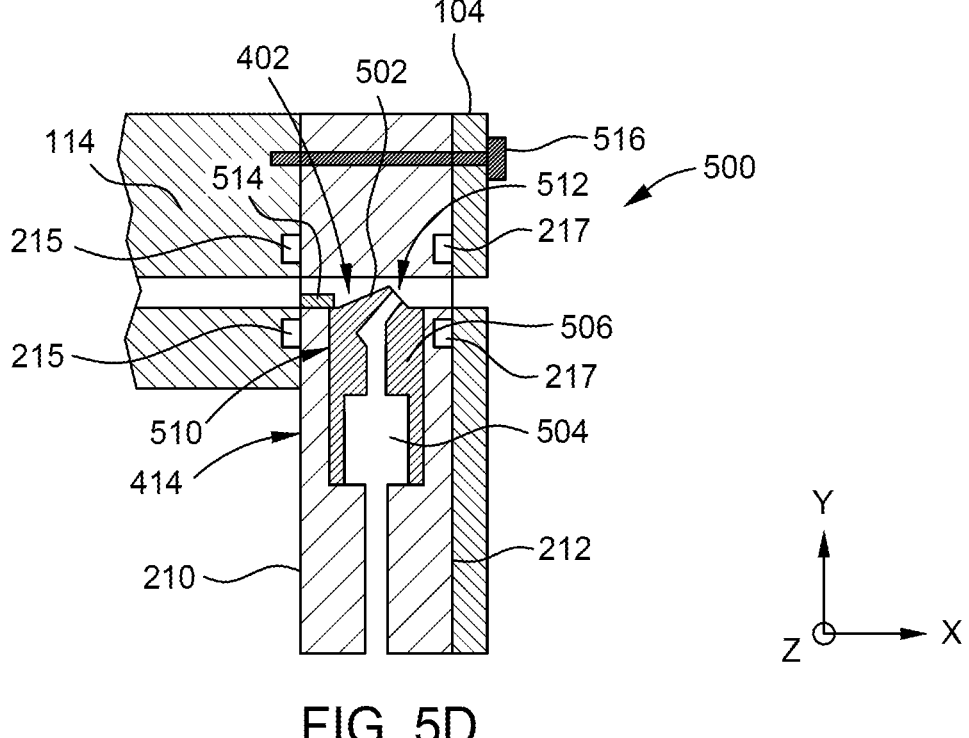

In some embodiments, which can be combined with other embodiments described herein, the deflector 402 does not include a hood, as shown in FIGS. 5C and 5D. FIG. 5C depicts a deflector, such as a removable deflector having a top surface with nozzle outlet 506 that is substantially coplanar with a lower surface 218 of the manifold opening 220. The nozzle outlets 506 are oriented upward and perpendicular to the lower surface 218 of the opening. Alternatively, the nozzle outlets 506 are oriented toward the process chamber 104, as shown in FIG. 5D. The nozzle outlets 506 are oriented at an angle of about 0 degrees to about 90 degrees relative to the horizontal axis.

In summation, a gas assembly having multiple, independently controlled purge zones is provided disposed between a mainframe door and process chamber. The gas assembly provides uniform (and/or non-uniform), customizable, controllable, cross-flow distribution into a processing volume. The gas assembly is useful any process chamber, such as a cross-flow process chamber, such as epitaxy, radical oxidation, in situ steam generation (ISSG), semiconductor reactors. The gas assembly can be retrofitted to existing process chambers by moving the process chamber away from the mainframe door of the adjacent chamber (such as transfer chamber), and placing the gas assembly.

While the foregoing is directed to embodiments of the present disclosure, other and further embodiments of the disclosure may be devised without departing from the basic scope thereof, and the scope thereof is determined by the claims that follow.

As used herein, the term "about" refers to a +/−10% variation from the nominal value. It is to be understood that such a variation can be included in any value provided herein.

What is claimed is:

1. A manifold comprising:
an adapter plate comprising a first major surface, a second major surface opposing the first major surface, and an opening extending through the adapter plate from the first major surface to the second major surface;
one or more plenums disposed within the adapter plate, the one or more plenums formed in the adapter plate between the first major surface and the second major surface, the one or more plenums fluidly coupled to the opening by one or more nozzles;
a deflector extending from a surface of the adapter plate to a surface of the opening of the adapter plate, wherein the deflector comprises one or more outlets of the one or more nozzles, wherein the one or more nozzles are oriented towards the deflector, wherein the deflector comprises a hood having a top surface and a backboard supporting the hood, wherein the hood is perpendicular to the one or more nozzles and the top surface is substantially parallel and coplanar to the surface of the opening and wherein the deflector comprises a plurality of fins, each fin of the plurality of fins separating adjacent outlets of the one or more outlets;
one or more gas passages formed in the adapter plate, each of the one or more gas passages extending from a third surface of the adapter plate to the one or more plenums; and
a groove formed in the first major surface, wherein the groove encircles the opening.

2. The manifold of claim 1, wherein the adapter plate comprises a plurality of fastener openings for accommodating fasteners, the plurality of fastener openings disposed from the first major surface to the second major surface around a perimeter of the adapter plate.

3. The manifold of claim 1, wherein the one or more plenums comprises about 2 to about 9 plenums, wherein each plenum comprises 1 to 8 nozzles.

4. The manifold of claim 1, wherein the manifold comprises:
a removable insert disposed within the adapter plate, wherein the removable insert comprises the one or more plenums and the one or more nozzles.

5. The manifold of claim 1, wherein the opening is rectangular.

6. The manifold of claim 5, further comprising a gap comprising a thickness between a leading edge of the hood and the adapter plate proximate to the process chamber that is less than a distance from the first major surface of the adapter plate and the second major surface of the adapter plate.

7. The manifold of claim 1, further comprising a surface of the adapter plate comprising one or more nozzle outlets, wherein the surface comprising one or more nozzle outlets is substantially coplanar with the surface of the opening of the adapter plate.

8. The manifold of claim 1, further comprising one or more flow control valves, wherein each of the one or more flow control valves is fluidly coupled to a respective plenum of the one or more plenums, and wherein each flow control valve is independently controlled.

9. The manifold of claim 1, wherein each of the one or more plenums have a different number of nozzles disposed therein.

10. A process system, comprising:
a process chamber comprising a substrate support;
a gas assembly, the gas assembly comprising:
a manifold with a first major surface and a second major surface opposing the first major surface, and an opening extending through the manifold from the first major surface to the second major surface;
one or more gas passages formed in the manifold and in fluid communication with a process volume of the process chamber, the one or more gas passages coupled to the opening by one or more nozzles;
a deflector, extending from a surface of the manifold, comprising one or more outlets of the one or more nozzles to a surface of the opening of the manifold, wherein the one or more nozzles are oriented towards the deflector, wherein the deflector comprises a hood having a top surface and a backboard supporting the hood, wherein the hood is perpendicular to the one or more nozzles and the top surface is substantially parallel and coplanar to the surface of the opening, wherein the deflector comprises a plurality of fins, each fin of the plurality of fins separating adjacent outlets of the one or more outlets, wherein the manifold is coupled to the process chamber at the second major surface; and a mainframe door coupled to the manifold at the first major surface.

11. The process system of claim 10, further comprising one or more flow control valves, wherein each of the one or more flow control valves is fluidly coupled to a respective gas line, wherein at least two of the one or more flow control valves are independently controlled.

12. The process system of claim 10, wherein the manifold further comprises one or more plenums disposed within the manifold, the one or more plenums formed in the manifold between the first major surface and the second major surface, the one or more plenums fluidly coupled to the opening by the one or more nozzles.

13. The process system of claim 10, wherein the deflector is configured to redirect gas from each nozzle into the process volume.

14. The process system of claim 10, wherein the hood is disposed about 1 to about 3 mm away from each nozzle.

15. The process system of claim 14, wherein the deflector forms an opening fluidly coupled to an opening of the process chamber.

16. The process system of claim 10, wherein the process chamber is an epitaxy chamber or a radical oxidation chamber.

17. The process system of claim 10, further comprising a gas source fluidly coupled to each of the gas passages.

18. A gas flow system comprising:

a manifold comprising a first major surface, a second major surface, an opening extending from the first major surface to the second major surface, and one or more plenums disposed within the manifold between the first major surface and the second major surface, each of the plenums comprising one or more nozzles, the one or more nozzles in fluid communication with the second major surface;

a deflector, extending from a surface of the manifold, comprising one or more outlets of the one or more nozzles to a surface of the opening of the manifold, wherein the deflector comprises a hood having a top surface and a backboard supporting the hood, wherein the hood is perpendicular to the one or more nozzles and the top surface is substantially parallel and coplanar to the surface of the opening, wherein the deflector comprises a plurality of fins, each fin of the plurality of fins separating adjacent outlets of the one or more outlets;

one or more gas lines extending from a third surface of the manifold to the one or more plenums, wherein at least two of the gas lines are independently controlled;

a transfer system mainframe door coupled to the first major surface; and a process chamber comprising a chamber opening, wherein the chamber opening is in fluid communication with the one or more nozzles.

19. The manifold of claim 1, wherein each fin of the plurality of fins extends from a surface of the deflector to the hood.

20. The manifold of claim 1, wherein the plurality of fins are angled in an acute angle or an obtuse angle relative to a plane of the second major surface.

* * * * *